(12) United States Patent
Kasai et al.

(10) Patent No.: US 6,235,575 B1
(45) Date of Patent: May 22, 2001

(54) SEMICONDUCTOR DEVICE AND METHOD FOR MANUFACTURING SAME

(75) Inventors: Naoki Kasai; Hiroki Koga, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/304,591

(22) Filed: May 4, 1999

(30) Foreign Application Priority Data

May 8, 1998 (JP) .................................................. 10-125546

(51) Int. Cl.⁷ .................................................. H01L 21/8242
(52) U.S. Cl. ........................ 438/242; 438/239; 438/240; 438/241; 438/242; 438/243; 438/245; 438/250; 257/300; 257/301; 257/302
(58) Field of Search ................................ 438/242, 243, 438/381, 300, 239–241, 244–250; 257/300–302

(56) References Cited

U.S. PATENT DOCUMENTS

| | | | | |
|---|---|---|---|---|
| 5,060,031 | * | 10/1991 | Abrokwah et al. | 357/22 |
| 5,212,110 | * | 5/1993 | Pfiester et al. | 437/67 |
| 5,212,112 | * | 5/1993 | Lynch | 437/89 |
| 5,710,074 | * | 1/1998 | Tseng | 438/253 |
| 5,792,703 | * | 11/1998 | Bronner et al. | 438/620 |
| 5,840,591 | * | 11/1998 | Park et al. | 437/52 |
| 5,970,339 | * | 10/1999 | Choi | 438/243 |
| 6,060,746 | * | 5/2000 | Bertin et al. | 257/331 |

FOREIGN PATENT DOCUMENTS

| | | |
|---|---|---|
| 3-283419 | 12/1991 | (JP) . |
| 2-513287 | 4/1996 | (JP) . |
| 9-172173 | 6/1997 | (JP) . |

* cited by examiner

*Primary Examiner*—Matthew Smith
*Assistant Examiner*—G. Lee
(74) *Attorney, Agent, or Firm*—Young and Thompson

(57) ABSTRACT

A gate electrode 5 is provided on a surface of a semiconductor substrate 1, an insulation film 6 being formed over the gate electrode 5 and the side wall of the gate electrode 5 being covered by an insulation film 8, and, on a diffusion region 7 that is formed on the surface of the semiconductor substrate 1 at both sides of the above-noted gate electrode 5 and in a region that is sandwiched between the above-noted side walls 8, 8, a silicon single crystal is anisotropically grown in a direction that is perpendicular with respect to the semiconductor substrate 1, so as to form a pad 9, and the anisotropic growth of the silicon single crystal is only within a part 8a of the region sandwiched between parts of the side wall 8 that are perpendicular to the substrate surface.

6 Claims, 20 Drawing Sheets

Fig. 1
FIG. 1a
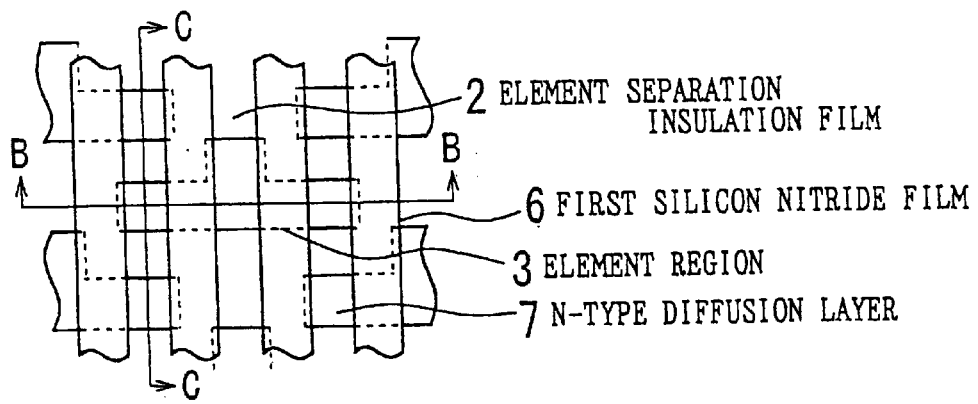
FIG. 1b
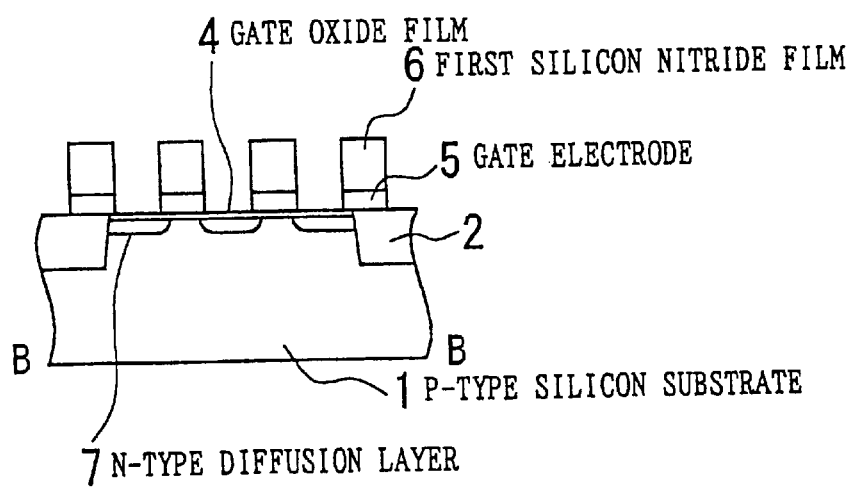
FIG. 1c
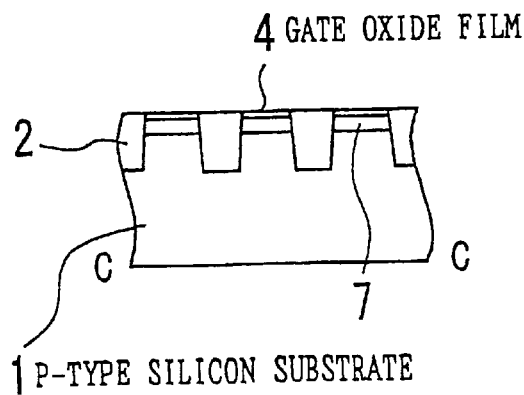

Fig. 2
FIG. 2a
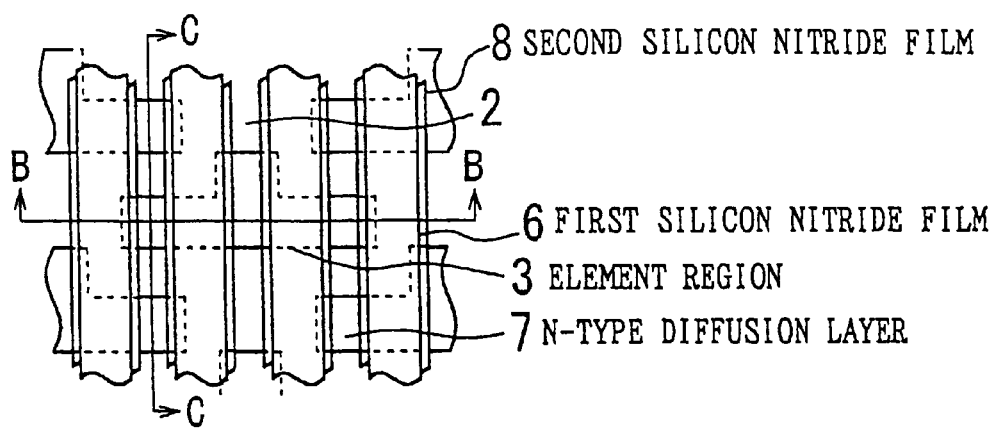
FIG. 2b
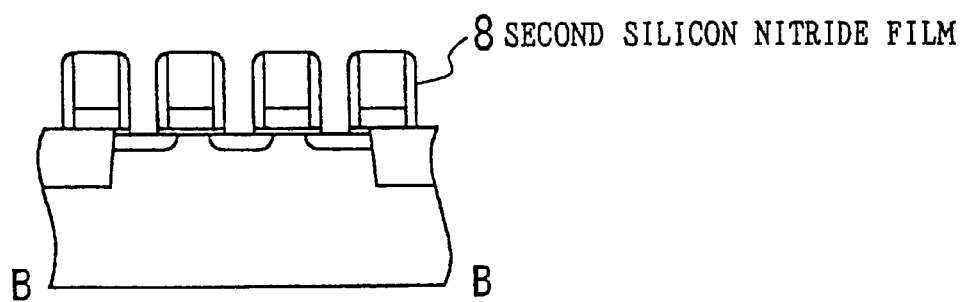
FIG. 2c
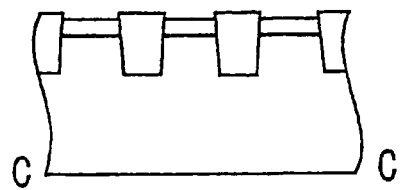

Fig. 3
FIG. 3a
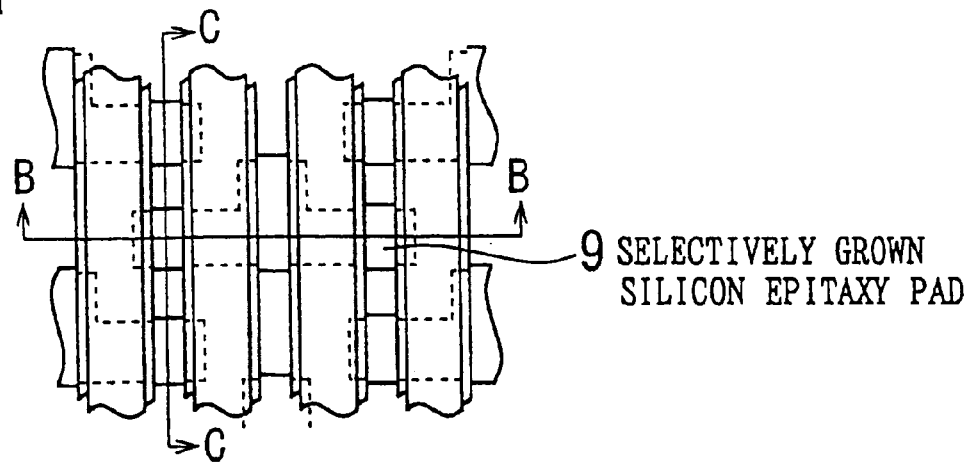
9 SELECTIVELY GROWN SILICON EPITAXY PAD
FIG. 3b
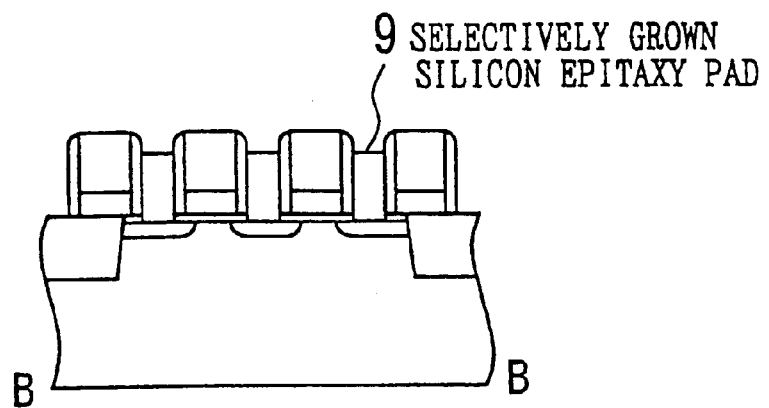
9 SELECTIVELY GROWN SILICON EPITAXY PAD
FIG. 3c
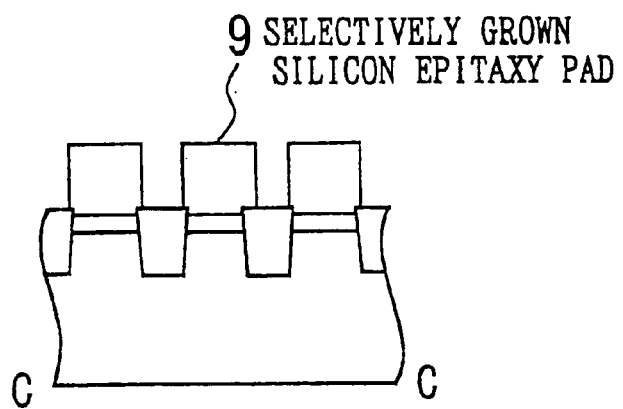
9 SELECTIVELY GROWN SILICON EPITAXY PAD Fig. 4
FIG. 4a
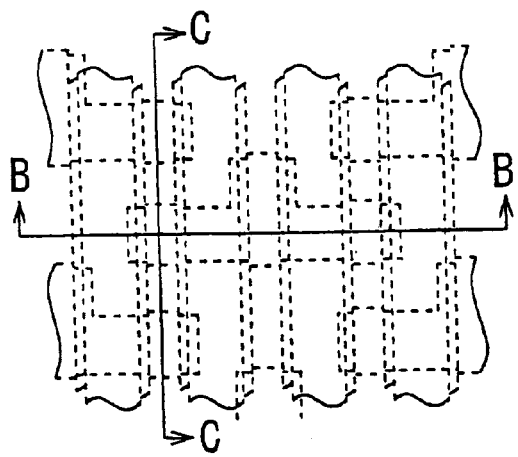
FIG. 4b
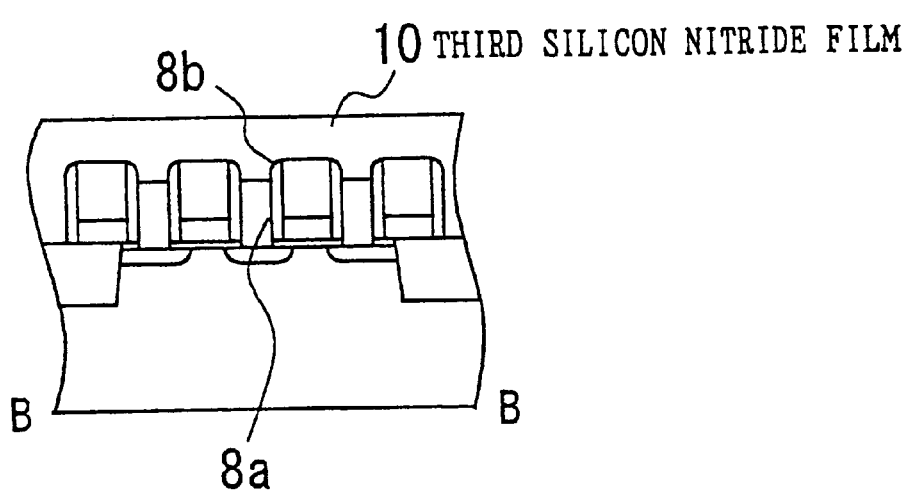
FIG. 4c
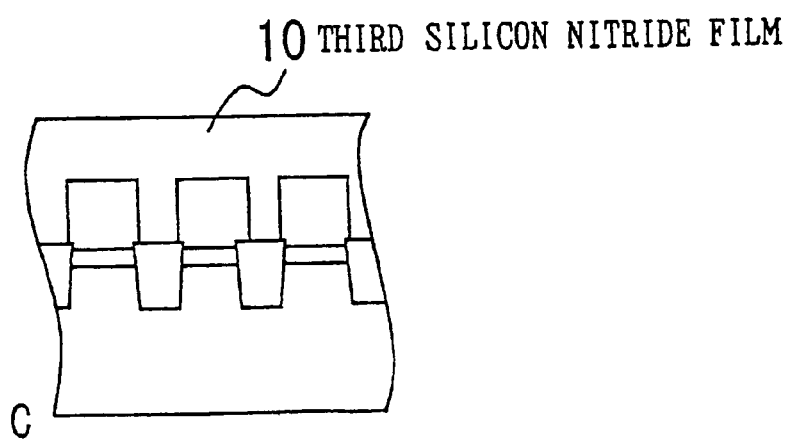

Fig. 5
FIG. 5a
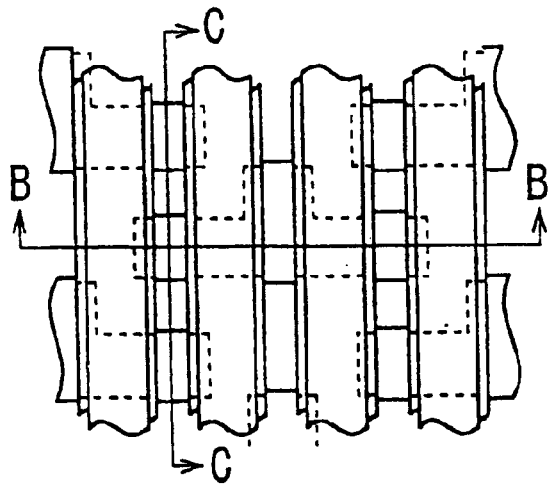
FIG. 5b
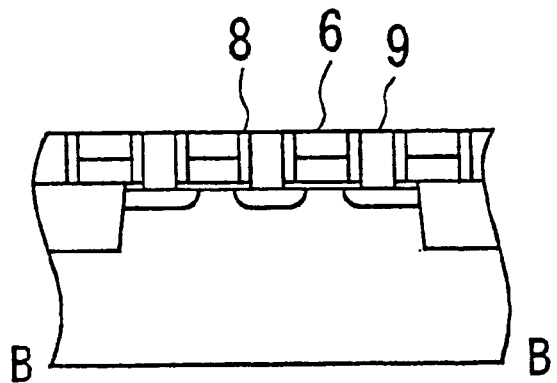
FIG. 5c
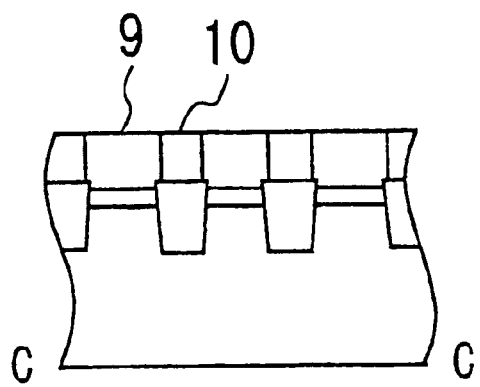

Fig. 6
FIG. 6a
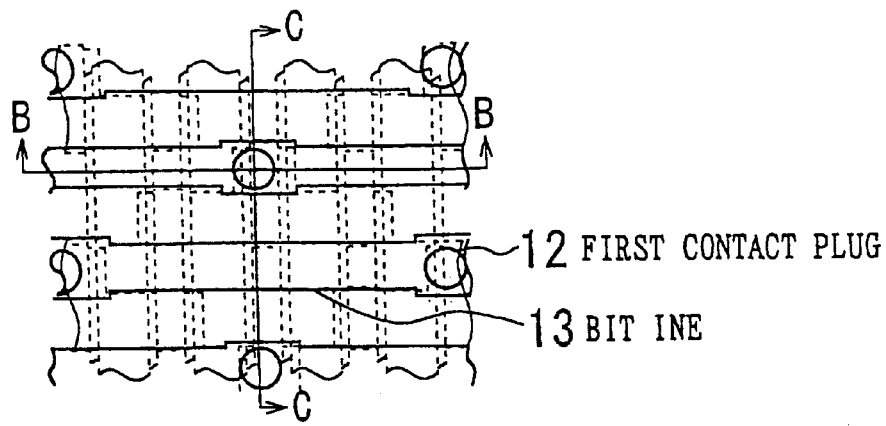
FIG. 6b
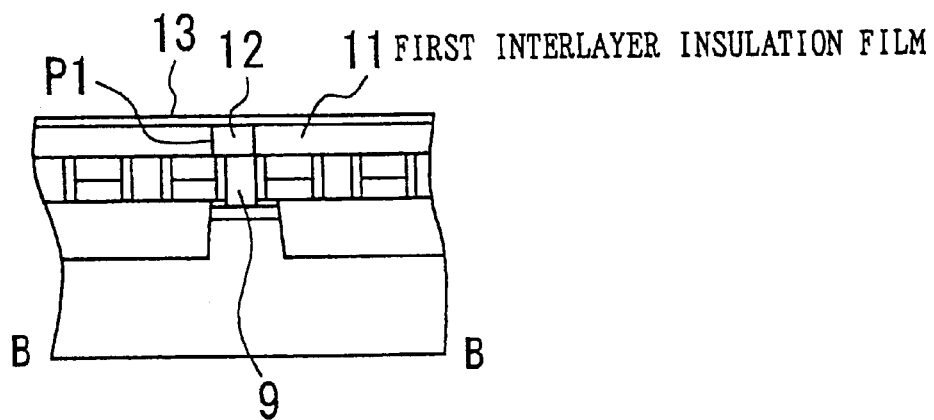
FIG. 6c
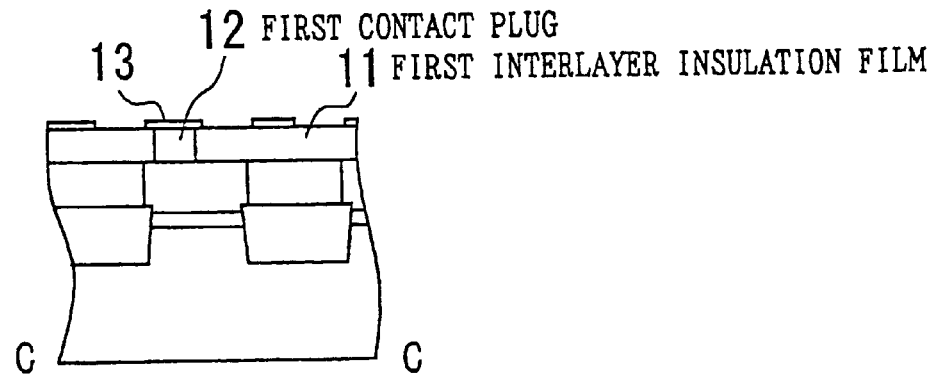

Fig. 7
FIG. 7a
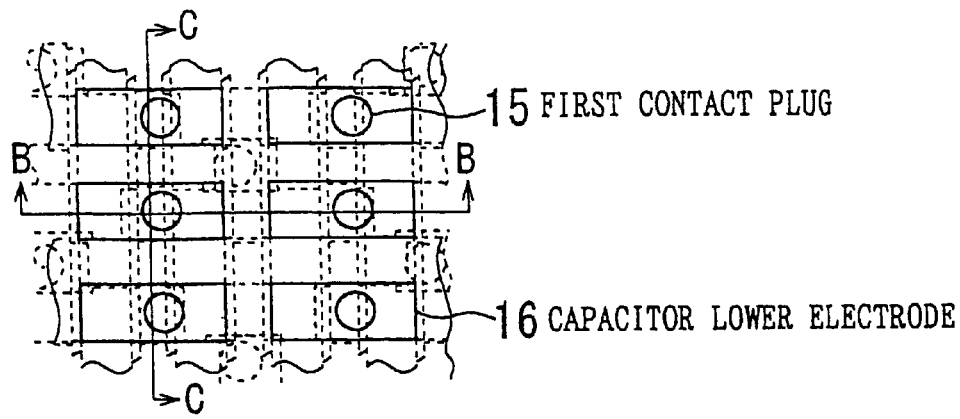
FIG. 7b
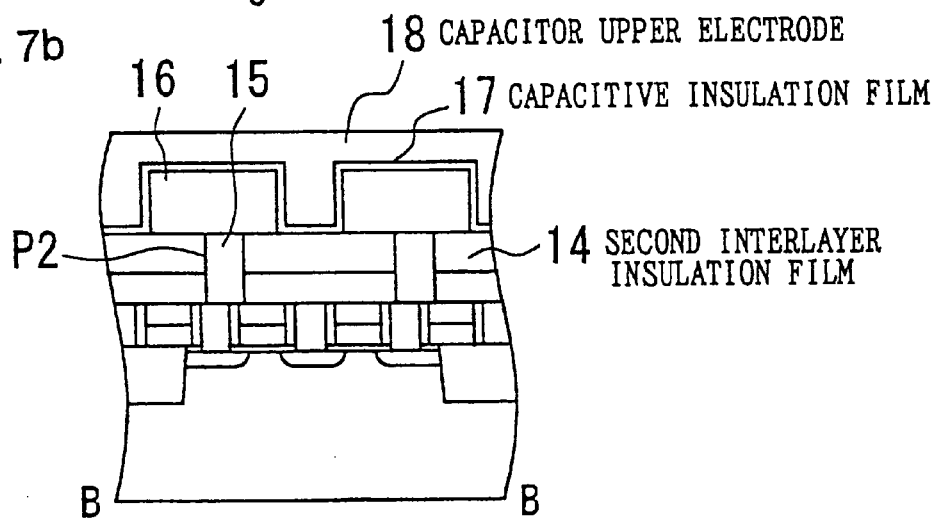
FIG. 7c
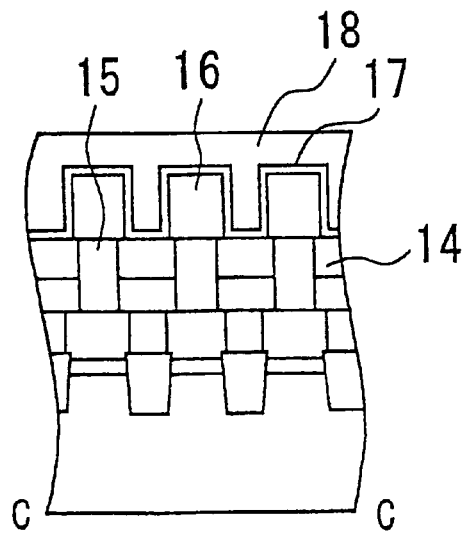

Fig. 9
FIG. 9a
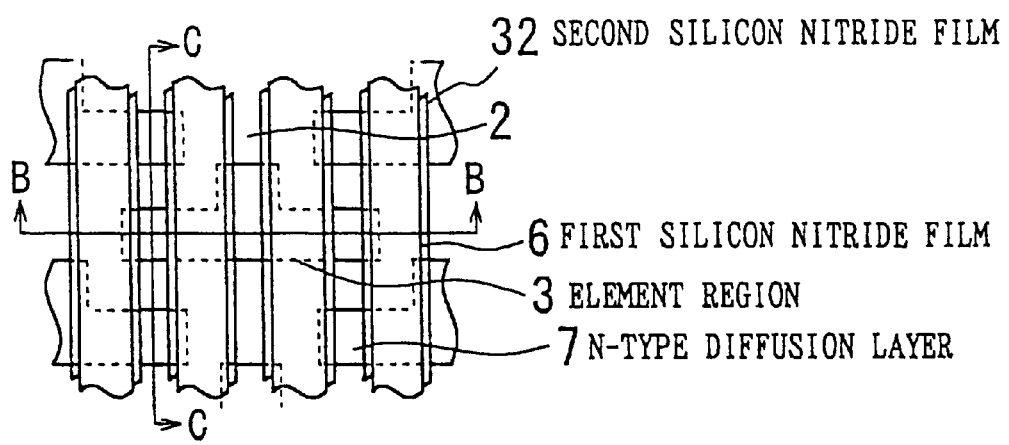
FIG. 9b
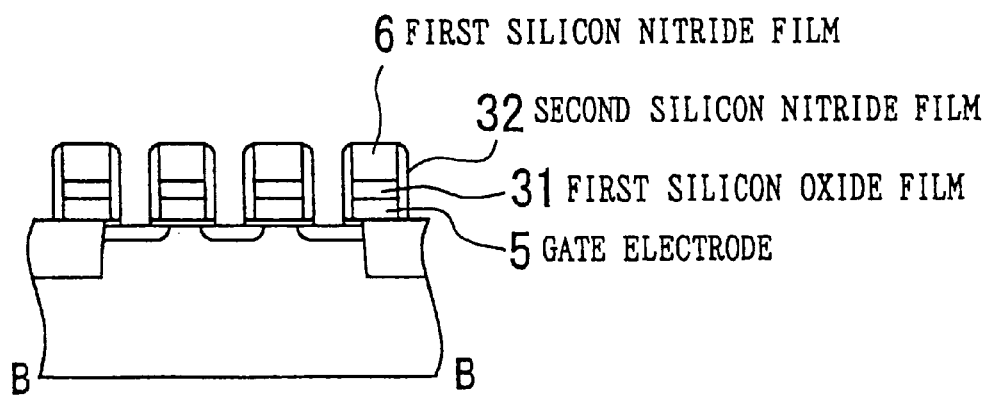
FIG. 9c
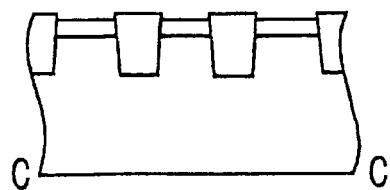

Fig. 10
FIG. 10a
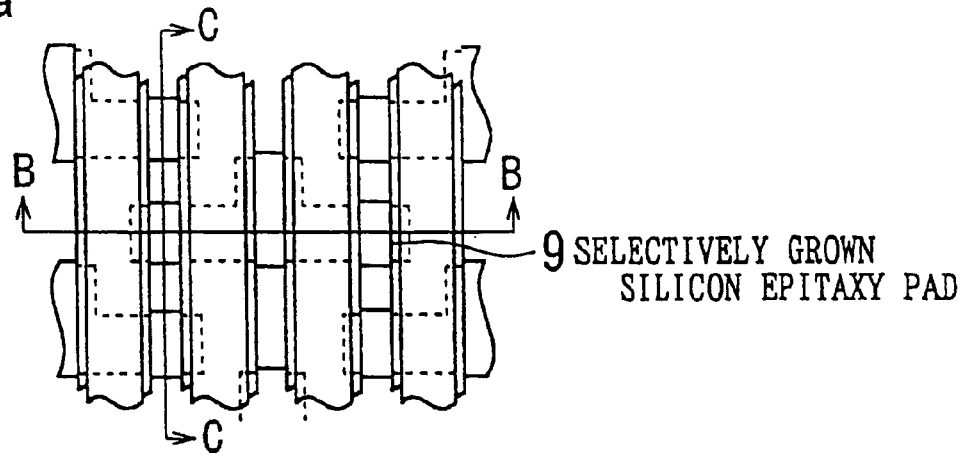
FIG. 10b
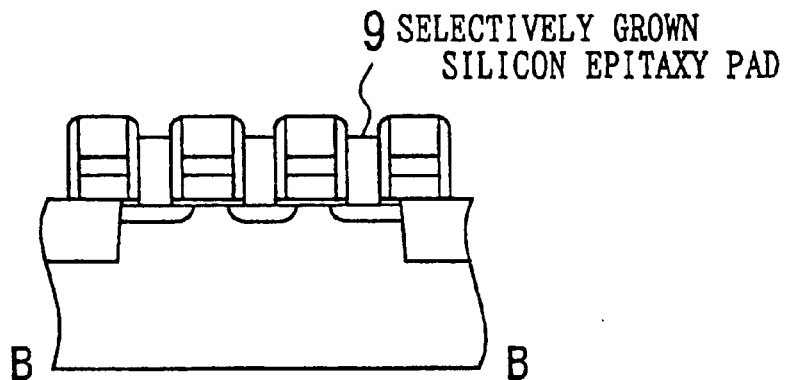
FIG. 10c
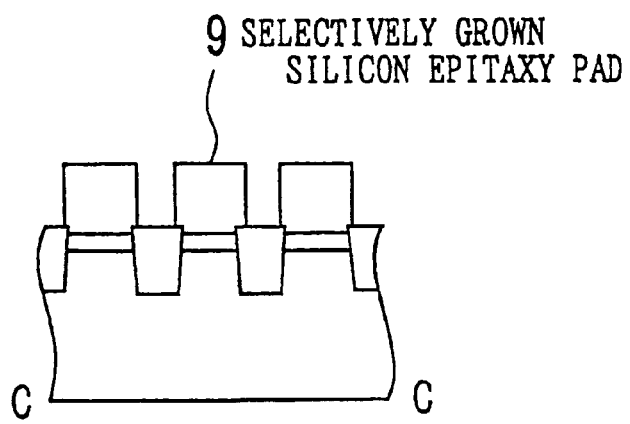

Fig. 11
FIG. 11a
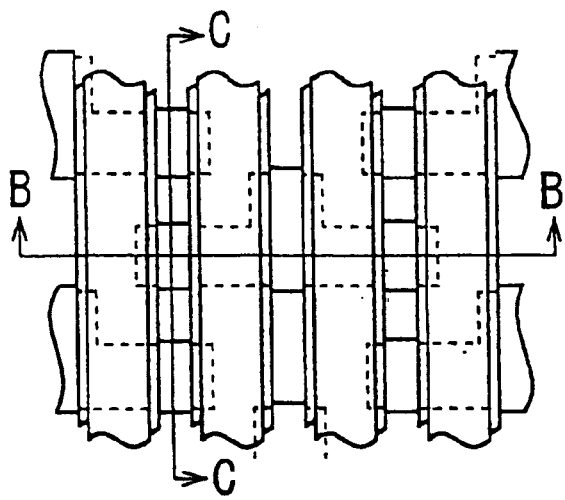
FIG. 11b
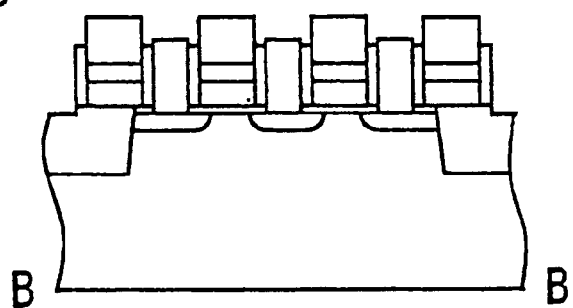
FIG. 11c
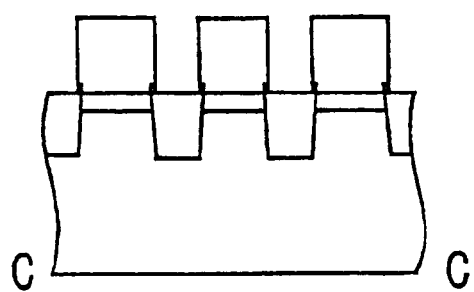

Fig. 12
FIG. 12a
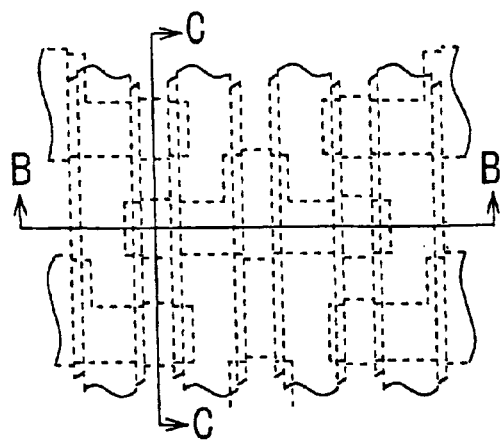
FIG. 12b
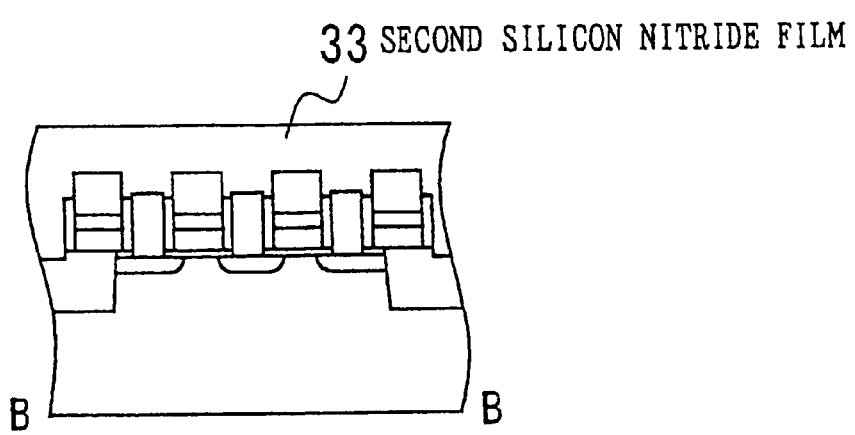
33 SECOND SILICON NITRIDE FILM
FIG. 12c
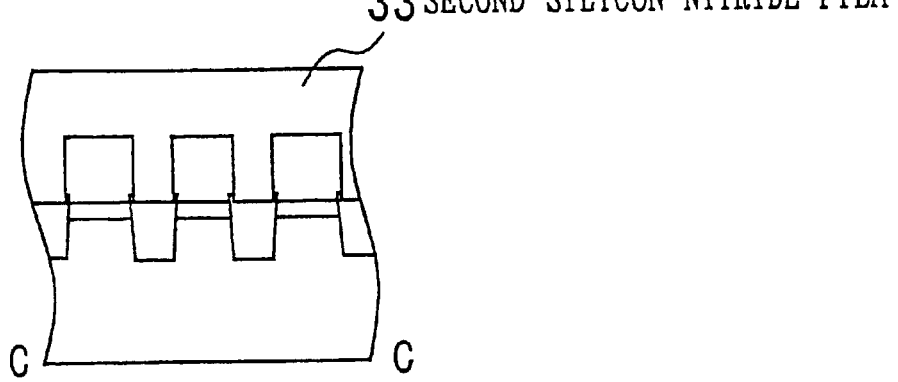
33 SECOND SILICON NITRIDE FILM Fig. 13
FIG. 13a
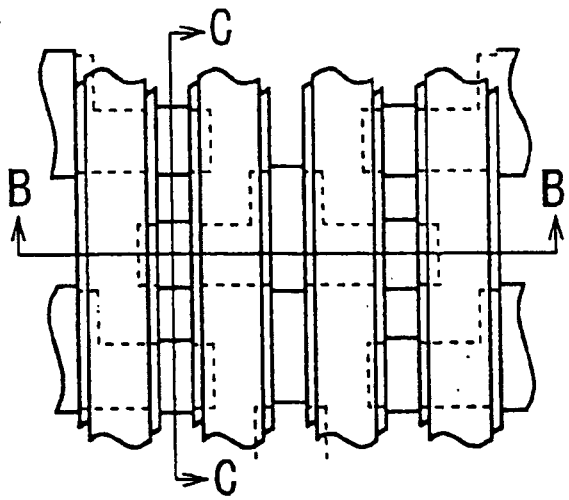
FIG. 13b
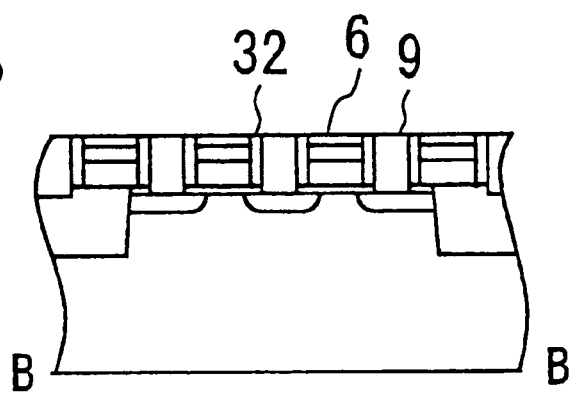
FIG. 13c
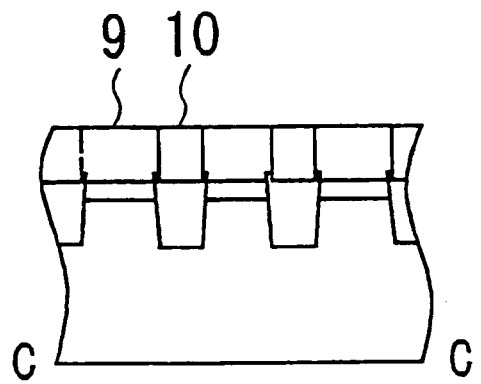

Fig. 14
FIG. 14a
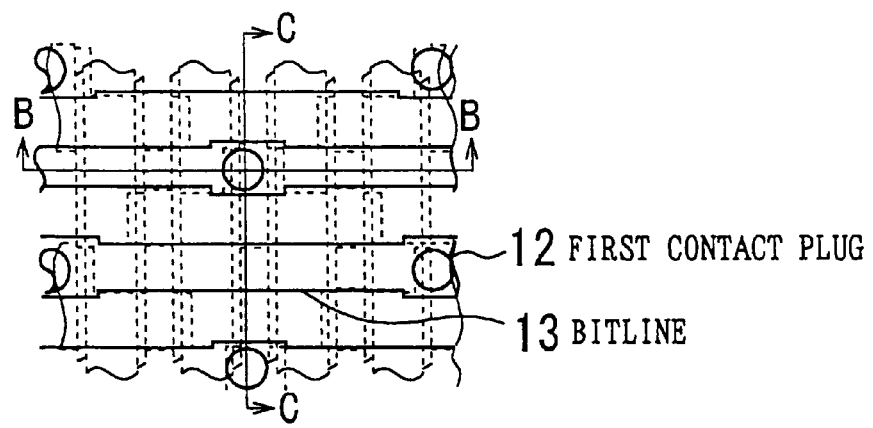
12 FIRST CONTACT PLUG
13 BITLINE
FIG. 14b
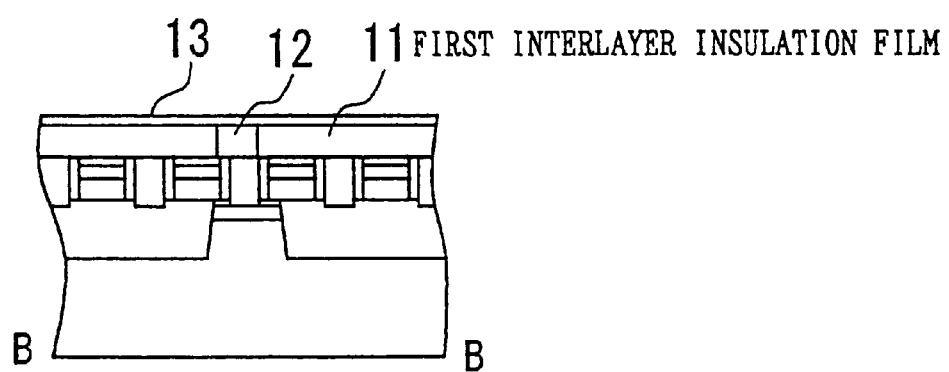
13  12  11 FIRST INTERLAYER INSULATION FILM
FIG. 14c
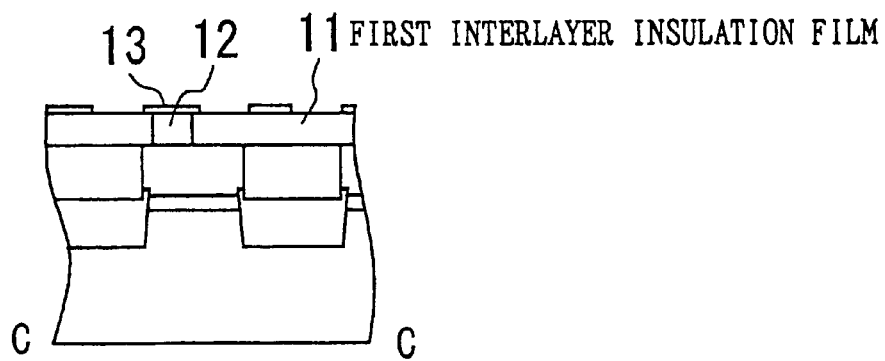
13  12  11 FIRST INTERLAYER INSULATION FILM Fig. 15
FIG. 15a
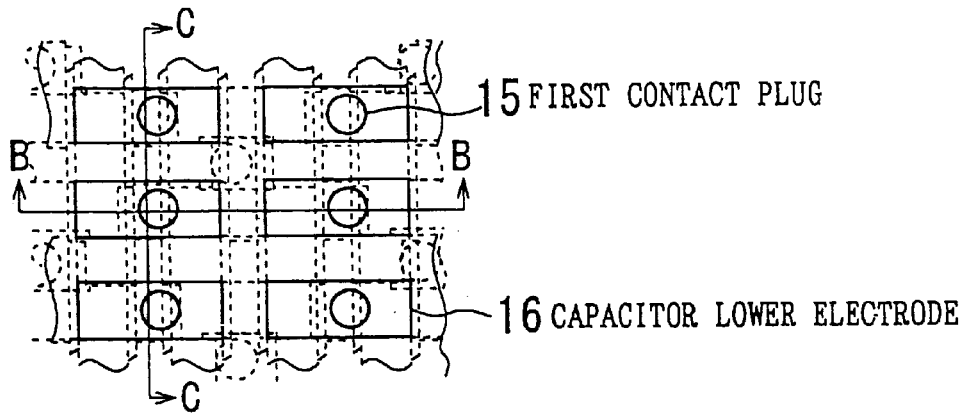
FIG. 15b
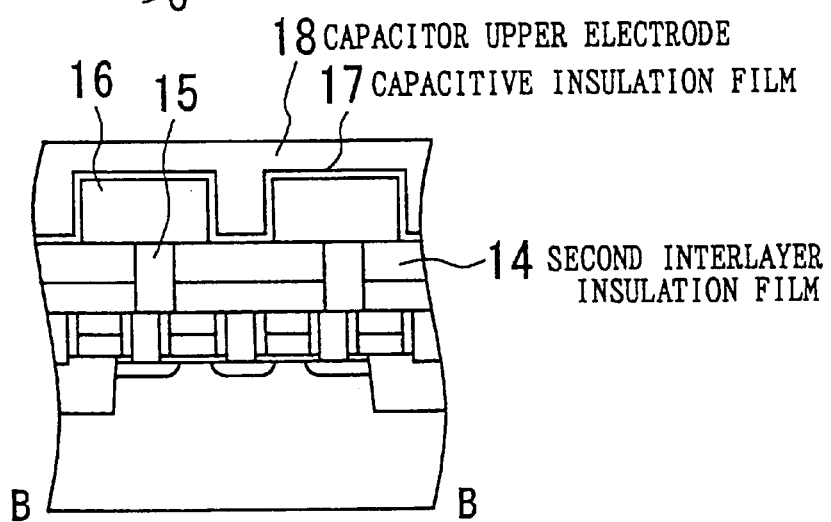
FIG. 15c
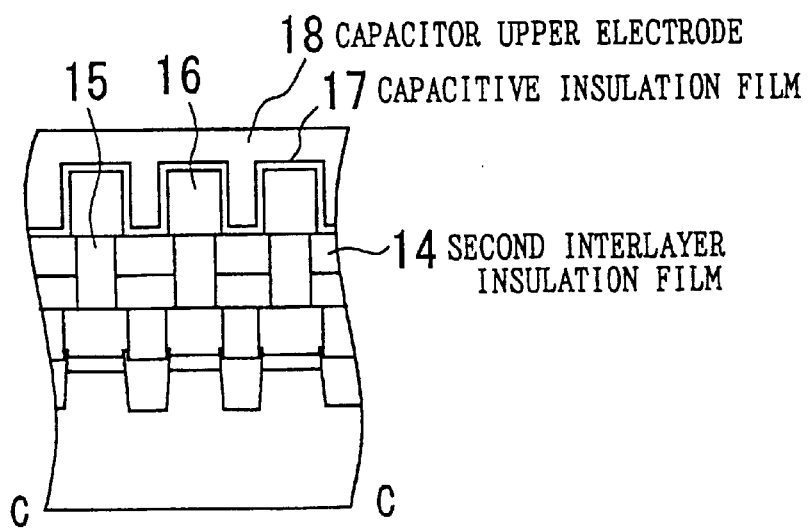

Fig. 16  PRIOR ART
FIG. 16a
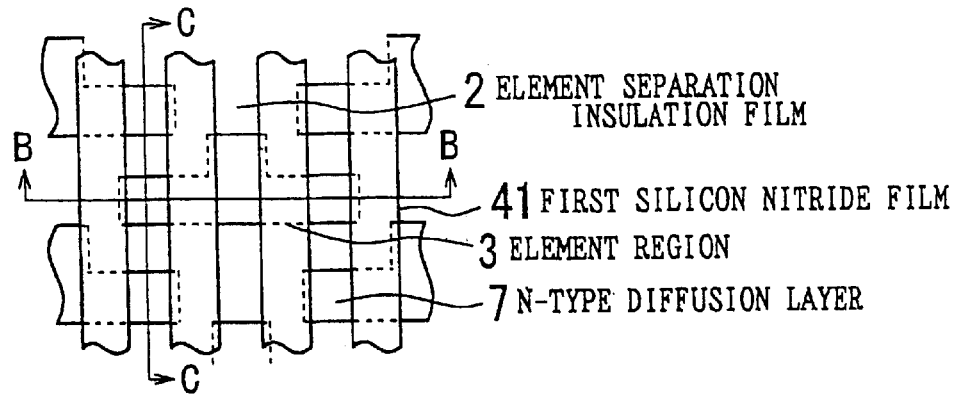
FIG. 16b
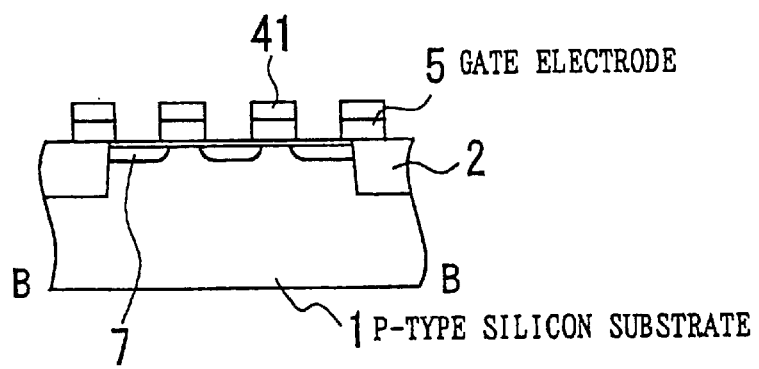
FIG. 16c
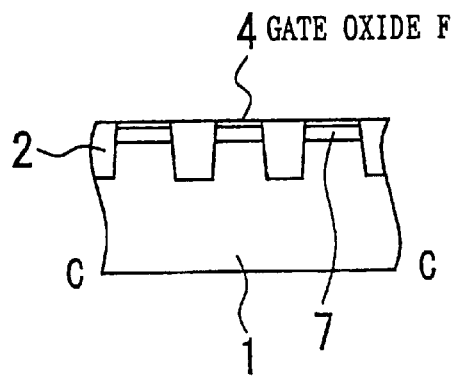

Fig. 17  PRIOR ART
FIG. 17a
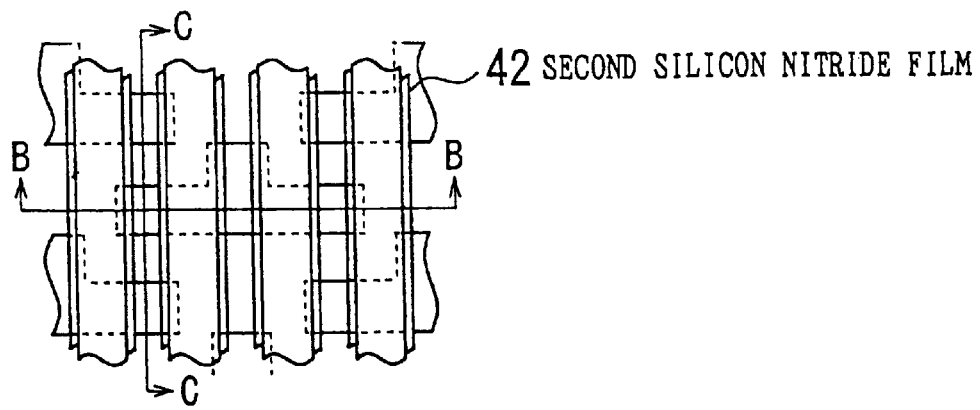
FIG. 17b
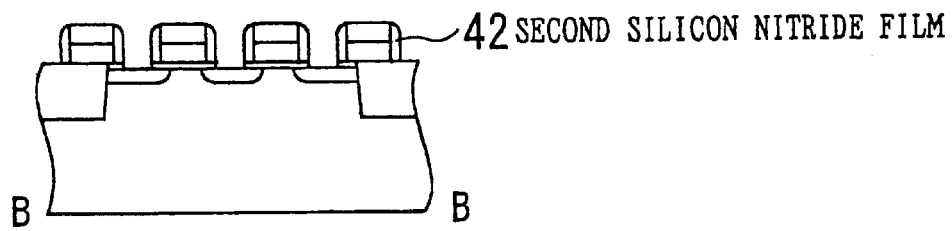
FIG. 17c
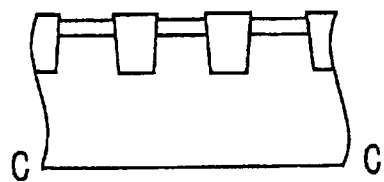

Fig. 18 PRIOR ART
FIG. 18a
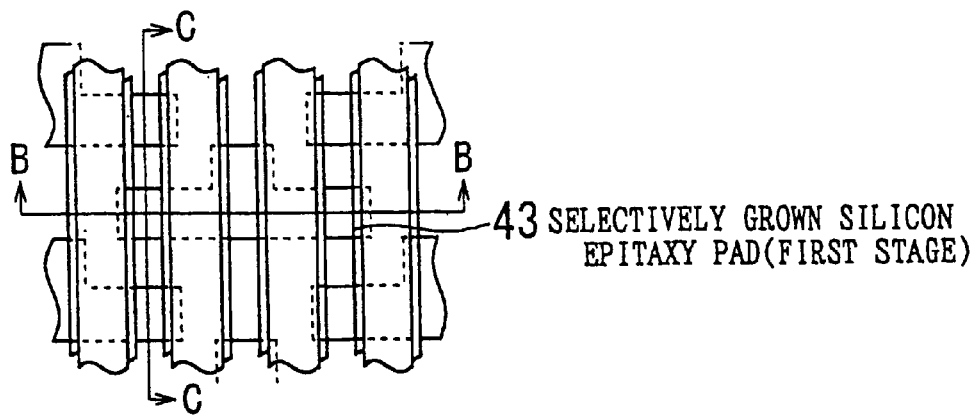
FIG. 18b
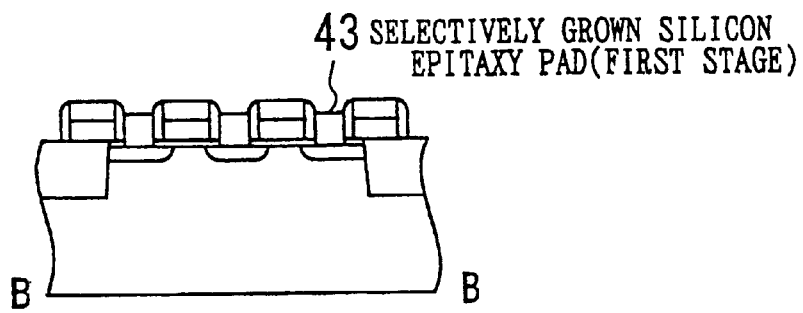
FIG. 18c
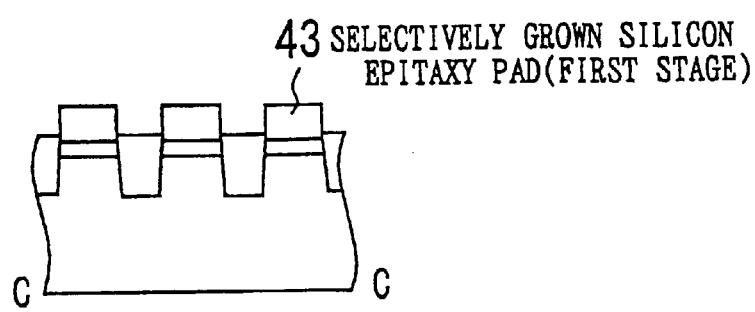

Fig. 19 PRIOR ART
FIG. 19a
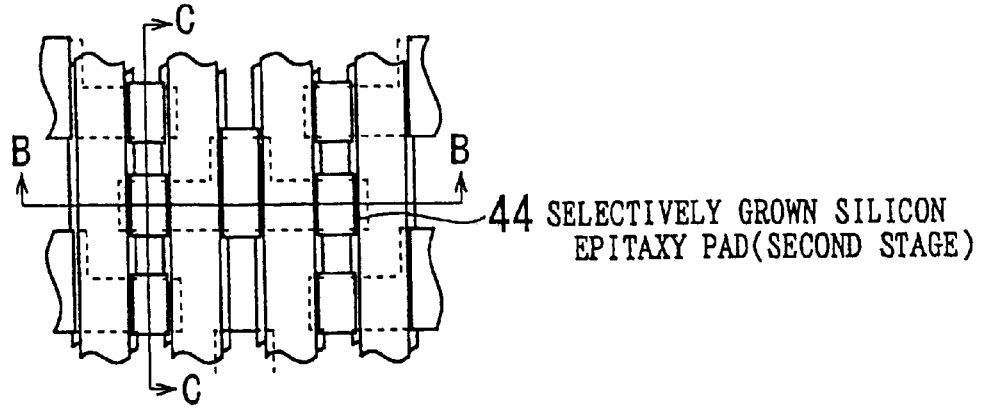
FIG. 19b
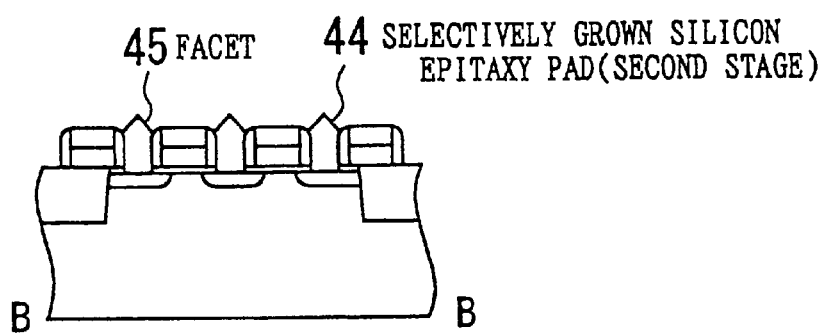
FIG. 19c
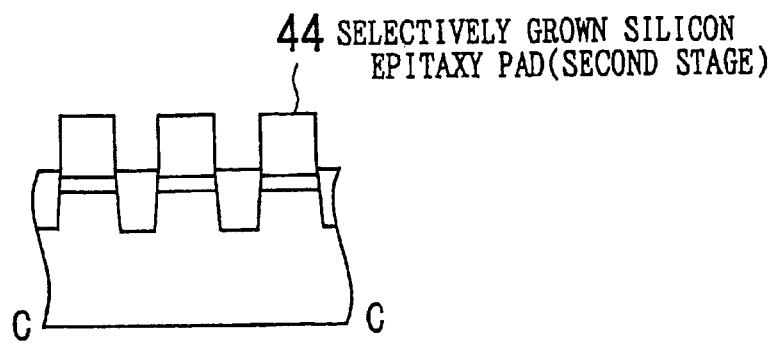

Fig. 20 PRIOR ART
FIG. 20a
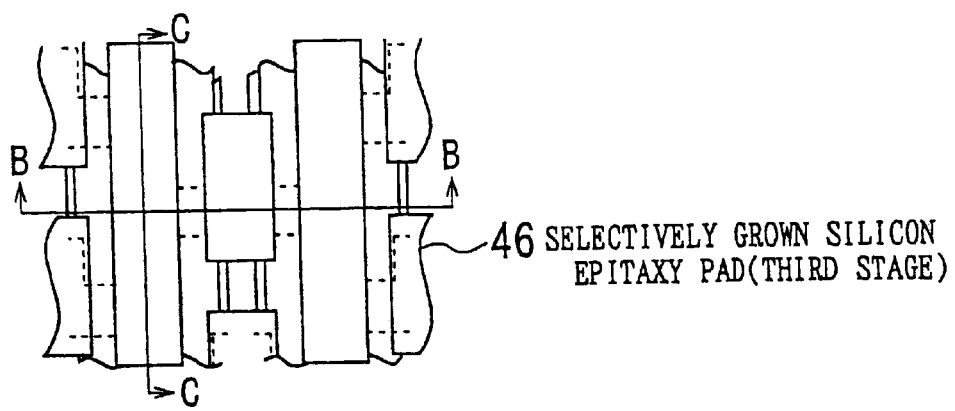
FIG. 20b
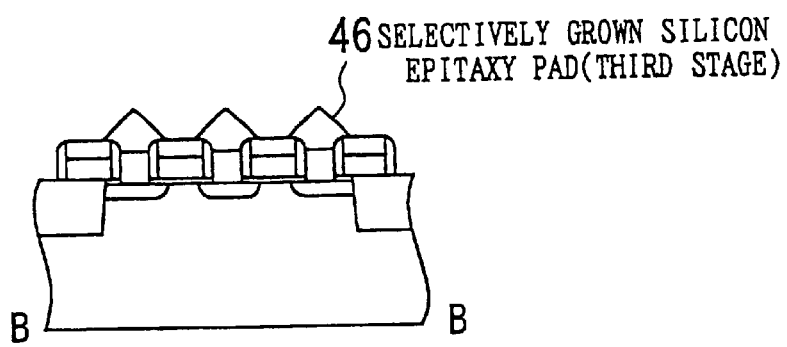
FIG. 20c
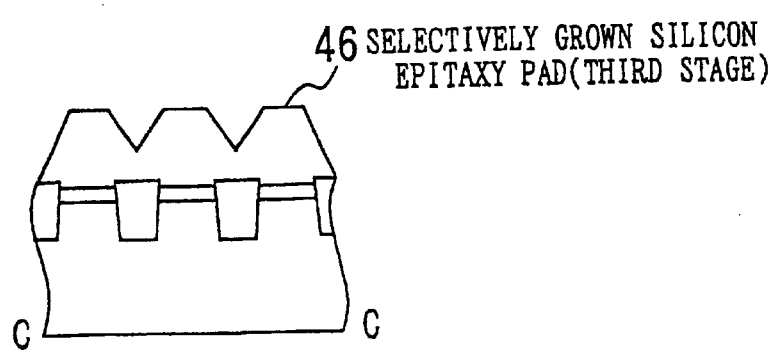

SEMICONDUCTOR DEVICE AND METHOD FOR MANUFACTURING SAME

BACKGROUND OF THE INVENTION

1. Field of the Invention

The present invention relates to a semiconductor device and to a method for manufacturing a semiconductor device, and more particular it relates to a semiconductor device that is suitable for use as a DRAM and a method for manufacturing such a semiconductor device.

2. Description of the Related Art

The level of integration of DRAMs has been undergoing an evolution of generations amounting to a 4-fold increase every 3 years. For this reason, there is a 0.7 shrinkage the minimum design feature each generation. The surface area of memory cells used to store information is undergoing a 0.4 shrinkage each generation. A simple squaring of this 0.7 ratio, without changing the memory cell layout, means that the surface area ratio should be approximately 0.5. In reality, however, the shrinkage ratio is 0.4. To achieve this, it is necessary to change the memory cell layout. One method of doing that requires the design margin with respect to contacts between interconnects to be made smaller. If the design margin between interconnects and contacts is made smaller and contacts are formed by the same method that was used in the past, manufacturing variations in, for example, position in the lithography process cause a reduction in yield because of contact between interconnects and contacts. Because of this problem, a self-aligning contact method has been proposed as a method of forming contacts which do not make contact, even in the case in which the margin between interconnects and contacts is reduced. The inventers filed Japanese patent application No.09-174724 for that method, which will be hereinafter referred to as the prior art method. In subsequent experiments, however, problems developed in applying the prior art method to further reductions in the small size of the memory cell. These problems will be described, with reference made to FIG. 16 through FIG. 20.

A first silicon nitride film 41, having a film thickness of 100 nm, is deposited on a gate electrode 5 using the CVD method. Then, a CVD is used to deposit a second silicon nitride film, having a film thickness of 50 nm, over the entire surface, and anisotropic etching is performed so that the second silicon nitride film 42 remains only on the side surface of the gate electrode 5 and the first silicon nitride film 41. As a result, the surface of the gate electrode 5 is entirely covered by an insulation film. When this is done, etchback is done so as to reduce the thickness of the first silicon nitride film 41 to approximately 70 nm. What is important to note here is the formation of the second silicon nitride film 42. On the side surface of the gate electrode 5, the side surface of the second silicon nitride film 42, similar to the side surface of the gate electrode 5, is formed so as to be perpendicular to the main surface of the substrate. On the side surface of the first silicon nitride film 41, the upper part is formed so as to be rounded at the corner. Only the surface of the n-type diffusion layer 7 that is formed on the p-type silicon substrate 1 is exposed. Single-crystal silicon is selectively grown anisotropically onto only this exposed surface, in a manner that is perpendicular to the main substrate surface, the result being the formation of a selectively grown silicon epitaxy pad. When forming this selective silicon epitaxy pad, problems arise. Anisotropic growth is only in a direction that is perpendicular with respect to the main surface of the substrate (that is, vertical), and there is no growth in a direction that is parallel to the main surface of the substrate (that is, horizontal). This will be described with reference to FIG. 18. First, consider the initial growth stage (hereinafter referred to as the first stage). A word line is formed that extends from the upper part to the lower part as shown in FIG. 18(a). Therefore, there is no broadening in the horizontal direction in the cross-sectional view of FIG. 18(b) because of the wall formed by the second silicon nitride film 42. The horizontal direction in the plan view of FIG. 18(c), however, because there is no word line, it is possible to have growth in the horizontal direction, even at the first stage. If the selective silicon epitaxy growth is isotropic growth, a selective silicon epitaxy pad will broaden in all directions. In isotropic growth, neighboring selective Silicon epitaxy pads on the element separation insulation film 2 make contact with one another. The method of growth to avoid this contact is anisotropic growth, and even in the case in which there is no obstacle in the horizontal direction, the speed of growth is quite small. This anisotropic growth is performed as described below. Specifically, with a crystal orientation of the p-type silicon substrate 1 as the (100) plane, the (110) plane is taken as the crystal orientation for a direction that is perpendicular to or parallel to the word line. By reducing the amount of flow of disilane gas, which is the gas used for silicon growth, from 10 sccm, which is the condition for isotropic growth, to 2 sccm, the speed of grow of the (110) plan with respect to the (100) plane is approximately $\frac{1}{20}$. By defining the growth stage in this manner, the first stage is taken as the growth up to a height that maintains a perpendicular shape with respect to the substrate main surface, this being growth of the selective silicon epitaxy pad up to the reference numeral 43 in FIG. 18. The second stage is the growth stage after the first growth stage, this being the growth up until the point at which the side surface of the second silicon nitride film is rounded. In the region of this rounded shoulder, as shown in FIG. 19(b), it is possible to have gradual broadening in the horizontal direction. It is precisely because the angle of the shoulder changes gradually that this means a gradual change of the crystal orientation at the growth edge from the (110) direction to the (111) direction. A facet plane 45 appears as a change in the crystal orientation at the growth edge from (100) to either the (111) plane or (311) plane. Because these facet planes, similar to the (110) plane, have a growth that is slower than the speed of growth of the (100) plane, growth of the selective silicon epitaxy pad in the height direction is suppressed. Therefore, not only is it not possible to control the height growth by the growth time, it also becomes difficult to even grow to the required height. If the growth is forced under weak conditions for anisotropic growth, as shown in FIG. 20(c) there will be broadening on the element separation insulation film 2, so that neighbors make contact with one another. If, instead of the second stage growth, which is shown in FIG. 19, a contact is formed after application of the prior art, because of the small height of the selective silicon epitaxy 44 in the second stage, it is not possible to achieve a structure such as shown in FIG. 5.

Accordingly, it is an object of the present invention to improve over the drawbacks of the prior art as described above, and in particular, when forming a pad by growing a silicon crystal on a semiconductor substrate anisotropically in a vertical direction with respect to the semiconductor substrate, to obtain accurate anisotropic growth. Another object of the present invention is to provide a method of manufacturing the above-noted semiconductor device.

It is yet another object of the present invention to provide a method of manufacturing a semiconductor device in which the parasitic capacitance of the bit line is made small, and the DRAM operating margin is made large.

SUMMARY OF THE INVENTION

In order to achieve the above-noted object, the present invention adopts the following basic technical constitution.

Specifically, the first aspect of the present invention is a method of manufacturing a semiconductor device. A gate electrode is provided on a semiconductor substrate, an insulation film is formed over said gate electrode and the side surface of said gate electrode is covered by a side wall insulation film, and, on a diffusion region that is formed on a surface of said semiconductor substrate at both sides of the above-noted gate electrode and in a region that is sandwiched between said side wall insulation films, a silicon single crystal is anisotropically grown in a direction that is perpendicular with respect to said semiconductor substrate, so as to form a pad, wherein said anisotropic growth of said silicon single crystal is only done within a part of said side wall insulation film that is vertical.

In the second aspect of the present invention, said insulation film on said gate electrode and said side wall insulation film are formed by a silicon oxide film.

In the third aspect of the present invention, said insulation film on said gate electrode is formed by a first step of depositing a silicon oxide film onto said gate electrode, and a second step of depositing a silicon nitride film onto said silicon oxide film.

In the fourth aspect of the present invention is that, after depositing said insulation film so as to cover the gate electrode, etchback is done to form a side wall and, if the gate electrode film thickness is GT, the thickness of said insulation film on said gate electrode is IT, the thickness of said insulation film that is removed by etchback on said gate electrode is EI, and the height of said pad that is selectively grown is SE, said silicon single crystal growth is done so that the relationship SE<(GT+IT−EI) is satisfied.

In the fifth aspect of the present invention, at the point at which said silicon single crystal growth is stopped, the height of said pad height is greater than the film thickness of said gate electrode.

In the sixth aspect of a method of manufacturing a semiconductor device according to the present invention, the semiconductor device is a DRAM.

In a method of manufacturing a semiconductor device according to the present invention, there is proposed a method a forming a contact within a DRAM memory cell that has a high degree of integration in a self-aligning manner, wherein a single-crystal silicon is grown selectively only on a diffusion region which will serve as the source and drain of a memory cell MOSFET, thereby forming a contact pad, this being combined with filling of the part of the surface other than the pad with an etching-stop film.

The present invention as shown in FIG. 1 through FIG. 7 can be simply compared with the prior art, as shown in FIG. 16 through FIG. 20 as follows. In the prior art, the film thickness of a first silicon nitride film 41 on the upper surface of a gate electrode 5 is thin, this being 70 nm. In the present invention, the first silicon nitride film 6 on the gate electrode has a large great thickness of 300 nm. In the case of the present invention, even if the selectively grown silicon epitaxy pad 9 is grown to 300 nm, the height of this selectively grown silicon epitaxy pad 9 is sufficiently lower than the total of the heights of the gate electrode 5 and the first silicon nitride film 6. As a result, the upper growth surface of the selectively grown silicon epitaxy pad 9 maintains the same crystal orientation as that of the main surface of the substrate and, for this reason, the height of 300 nm which is required of the selectively grown silicon epitaxy pad 9 can be controlled by means of the growth time. In contrast to this, in the prior art a facet 45 that is different from the main substrate surface appears during growth, thereby suppressing growth. In the present invention, this drawback is avoided.

BRIEF DESCRIPTION OF THE DRAWINGS

FIG. 1 is a drawing that illustrates the steps of the first embodiment of a method of manufacturing a semiconductor device according to the present invention.

FIG. 2 is a drawing that illustrates the steps sequent to those shown in FIG. 1.

FIG. 3 is a drawing that illustrates the steps sequent to those shown in FIG. 2.

FIG. 4 is a drawing that illustrates the steps sequent to those shown in FIG. 3.

FIG. 5 is a drawing that illustrates the steps sequent to those shown in FIG. 4.

FIG. 6 is a drawing that illustrates the steps sequent to those shown in FIG. 5.

FIG. 7 is a drawing that illustrates the steps sequent to those shown in FIG. 6.

FIG. 9 is a drawing that illustrates the steps sequent to those shown in FIG. 8.

FIG. 10 is a drawing that illustrates the steps sequent to those shown in FIG. 9.

FIG. 11 is a drawing that illustrates the steps sequent to those shown in FIG. 10.

FIG. 12 is a drawing that illustrates the steps sequent to those shown in FIG. 11.

FIG. 13 is a drawing that illustrates the steps sequent to those shown in FIG. 12.

FIG. 14 is a drawing that illustrates the steps sequent to those shown in FIG. 13.

FIG. 15 is a drawing that illustrates the steps sequent to those shown in FIG. 14.

FIG. 16 is a drawing that illustrates the prior art.

FIG. 17 is a drawing that illustrates the prior art.

FIG. 18 is a drawing that illustrates the prior art.

FIG. 19 is a drawing that illustrates the prior art.

FIG. 20 is a drawing that illustrates the prior art.

DESCRIPTION OF THE PREFERRED EMBODIMENTS

Figure 8:
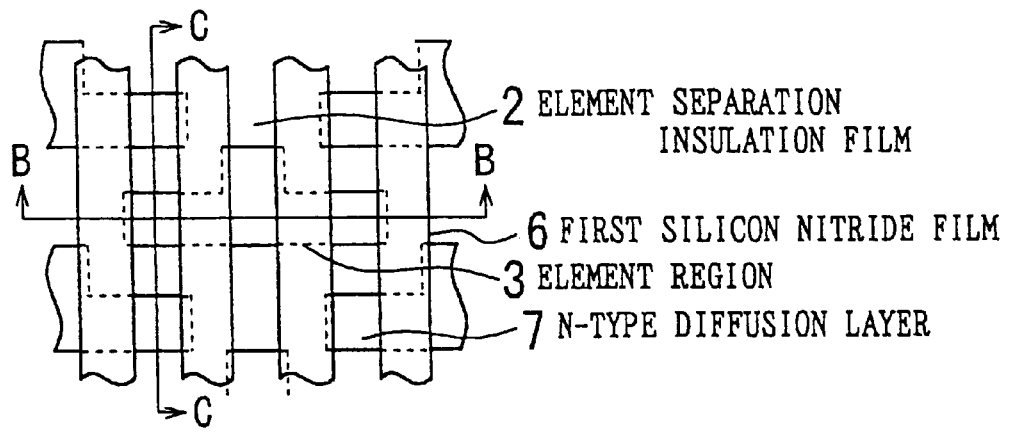
FIG. 8 is a drawing that illustrates the steps of the second embodiment of a method of manufacturing a semiconductor device according to the present invention.
Figure 8:
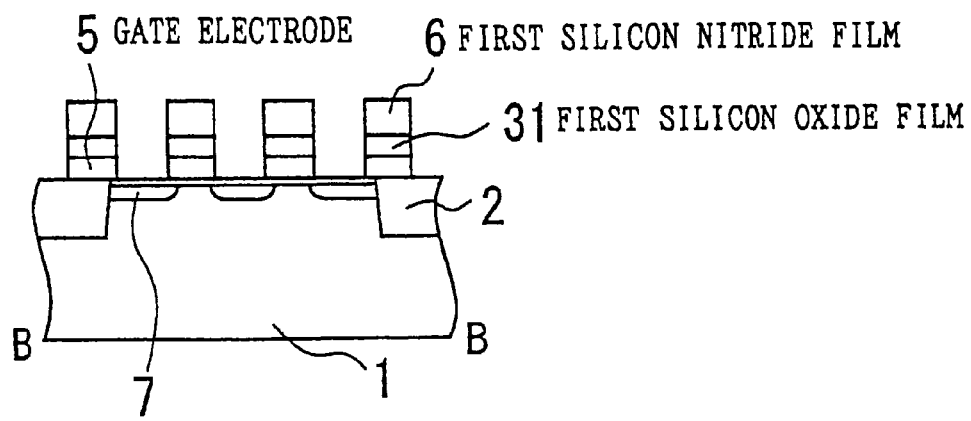
Figure 8:
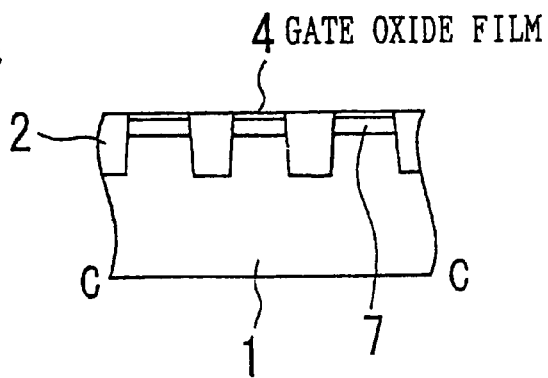

Embodiments of a method of manufacturing a semiconductor device according to the present invention are described in detail below, with references being made to relevant drawings.

FIG. 1 through FIG. 7 are drawings which show the specific structure of a semiconductor device according to the present invention.

These drawings show a method of manufacturing a semiconductor device wherein a gate electrode 5 is provided on a semiconductor substrate 1, an insulation film 6 being formed over the gate electrode 5 and the side wall of the gate electrode 5 being covered by an insulation film 8, and on a diffusion region 7 that is formed on the surface of the semiconductor substrate 1 at both sides of the above-noted gate electrode 5 and in a region that is sandwiched between the above-noted side walls 8, 8, a silicon single crystal is anisotropically grown in a direction that is perpendicular with respect to the semiconductor substrate 1, so as to form a pad 9. In this method, the anisotropic growth of the silicon single crystal is only done within a part 8a of the vertical side wall 8.

Therefore, in the rounded part 8b of the edge part of the side wall 8, the silicon single crystal is not grown.

Next, the present invention will be described in further detail.

The first embodiment of a method of manufacturing a semiconductor device according to the present invention is shown in cross-sectional view form in FIG. 1 through FIG. 7. Onto the main surface of a p-type silicon substrate 1, which is a silicon wafer with an orientation flat that is a side on the <110>direction and a main surface that is the (100) plane, this having a low resistance of approximately 5 Ω·cm, is formed an element separation insulation film 2, made of a silicon oxide insulation film, using a conventional trench separation method, thereby delineating an element region 3. The directions of the sides that form the element region 3 are formed by sides that are parallel or perpendicular to the orientation flat, the crystallographic direction of each side with respect to the p-type silicon substrate 1 being <110>. Each of the element regions 3 has a T-shape, and these are arranged in an regular manner on the main surface of the silicon substrate 1. On the surface of the element region 3, a gate insulation film 4 is formed, by means of thermal oxidation, this being formed to a film thickness of approximately 6.5 nm. Next, for example, by means of a the CVD process at approximately 700° C., using dichloro-silane and phosphine gas as the raw material gas and doping gas, respectively, an n-type polysilicon film (not shown in the drawing) is formed over the entire surface, to a thickness of approximately 50 nm. Additionally, sputtering is used to form a tungsten silicide film (not shown in the drawing) over the entire surface to a thickness of approximately 100 nm. Then a CVD process is used to form a silicon nitride film over the entire surface to a thickness of approximately 300 nm. The above-noted silicon nitride film, tungsten silicide film and n-type polysilicon film are patterned using sequential anisotropic etching, so as to form a gate electrode 5 having a thickness of approximately 150 nm made of a tungsten polycide film (a laminate of an n-type polysilicon film and a tungsten silicide film) and a first silicon nitride film 6 having a thickness of approximately 300 nm and which selectively covers the upper surface of gate electrode 5. For example, by implanting phosphorus ions to a concentration of approximately $10^{13}$ cm$^{-2}$ at 30 keV an n-type diffusion layer 7 is formed on the surface of the element region so as to be self-aligned with the element separation insulation film 2 and the gate electrode 5. The depth of the junction of the n-type diffusion layer 7 is approximately 100 nm. The width of the n-type diffusion layer 7 is approximately 0.22 μm (220 nm), and the spacing of adjacent n-type diffusion layers 7 is approximately 0.18 μm (180 nm). A second silicon nitride film having a thickness of approximately 50 nm is formed over the entire surface, using a CVD process. Anisotropic etching using a fluorocarbon type of etching gas is done so as to do etchback, so as form the second silicon nitride film 8 that remains only on the side surface. In performing this etchback operation, the first silicon nitride film 6 is also subjected to etching, the film thickness of the first silicon nitride film 6 being approximately 280 nm. The gate oxide film 4 of the surface of the n-type diffusion layer 7 is removed with self-alignment with respect to the second silicon nitride film 8 and the element separation insulation film, the surface of the n-type diffusion layer 7 being exposed in these parts.

Next, after removing the naturally formed oxide film that is formed on the first n-type diffusion layer 7, using UHV-CVD, anisotropic selective epitaxial growth is done on the exposed surface on the first n-type diffusion layer 7, using for example disilane gas under the condition of a flow amount of 2.0 sccm, at a temperature of 625° C., a pressure of approximately 1×10$^{-2}$ (Pa) and a flow amount of approximately 2.0 sccm as a doping gas (formed by diluting 1% phosphine in hydrogen), so as to form in a self-aligned manner a selective silicon epitaxy pad 9 having a height (film thickness) of approximately 300 nm. Under these conditions, the speed of growth of the single-crystal silicon layer (100) plane in the <100>direction is approximately 10 nm/minute. When this is done, the speed of growth of the silicon single-crystal layer (100) plane in the <110>direction that intersects with the silicon oxide film surface such as the element separation insulation film is approximately ½₀ of the speed of growth of the (100) plane in the <100>direction. Because the exposed surface of the n-type diffusion layer 7 that is formed so as to be self-aligned with the element separation film 2 and the second silicon nitride 8 is surrounded by sides in the <110>direction, these selectively grown silicon epitaxy pads are chiefly selectively grown in the <100>direction, which is perpendicular to the p-type silicon substrate main surface. The method of performing the above-noted selective anisotropic epitaxial growth is preferably performed at a growth temperature in the range from 500° C. to 800° C. and at a pressure in the range from 1×10$^{-3}$ Pa to 5×10$^{-2}$ Pa. If the growth temperature is lower than 500° C., it is not possible to obtain single-crystal silicon, and if the growth temperature is higher than 800° C., it is difficult to do doping of a conductive impurity such as phosphorus. If the above-noted pressure range is not observed, it becomes difficult to perform "anisotropic" growth. The selectivity of this "anisotropic" growth becomes better, the higher is the growth temperature, and the smaller is the amount of disilane. Even if monosilane (HSi$_4$) is used as the raw material gas instead of disilane, it is still possible to achieve anisotropic selective epitaxial growth of the single-crystal layer. However, for this gas the growth temperature range is shifted upward by 80° C. to 100° C. in comparison with the use of disilane gas. Furthermore, even if dichlorosilane is used as the raw material gas, it is still possible to achieve anisotropic selective epitaxial growth of the single-crystal layer. However, with this gas, there is the problem of many facets occurring. If the grown film thickness exceeds 400 nm, it reaches the shoulder part 8b of the second silicon nitride 8, this causing the problem of the occurrence of facets.

Next, as shown in FIG. 4, a CVD process is used to deposit a third silicon nitride film 10 having a thickness of 200 nm. Then, as shown in FIG. 5, by CMP (chemical mechanical polishing), the third silicon nitride film 10, the second silicon nitride film 8, and the first silicon nitride film 6 are polished. The degree of polishing is such as to absolute not expose the surface of the gate electrode 5, and also so as to expose the upper surface of the selectively grown silicon epitaxy pad 9. The surface other than the selectively grown silicon epitaxy pad 9 exposed part is a silicon nitride film formed by the third silicon nitride film 10, the second silicon nitride film 8, and the first silicon nitride film 6.

After the above steps, formation of a CVD silicon oxide film, formation of a BPSG film, reflow of the BPSG film, and CMP of the BPSG film and the like are performed, so as to form a first interlayer insulation film 11 that is formed as a silicon oxide film insulation film with a flat upper surface. A first contact hole P1 is passed completely through this interlayer insulation film 11, so as to reach the upper surface of the selectively grown silicon epitaxy pad 9. The diameter of this first contact hole P1 is approximately 0.20 μm, and even if misalignment, for example, in the photolithography process causes, especially the first contact hole P1 overlaps with the gate electrode 5 because of an offset to the left of approximately 60 nm as shown in FIG. 6(a) and FIG. 6(b), as the silicon nitride film 6 serves as the etching stopper, so that the first contact hole P1 does not reach the gate electrode 5. Next, after depositing an n-type polysilicon film having a thickness of approximately 300 nm using, for example, a CVD process, etchback is done so as to fill the first contact hole with the n-type polysilicon film, thereby forming the first contact plug 12. Then, for example, sputtering is used to form a conductive film made of tungsten silicide and having a thickness of approximately 120 nm, this conductive film-being patterned so as to form the bit line 13 (FIG. 7). Then, a second interlayer insulation film 14, which is made of a silicon oxide insulation film with a flat upper surface is formed. A second contact hole P2 is passed completely through the first and second interlayer insulation films 11 and 14 so as to reach the selectively grown silicon epitaxy pad 9. The diameter of this second contact hole P2 is also approximately 0.20 μm, and even if there is a large misalignment in the photolithographic process, the second contact hole P2 is not reached to the gate electrode 5, similar to the case of the first contact hole P1. Next, for example, a second contact plug 15, which is formed by a conductive film such as an n-type polysilicon film, is used to fill the second contact hole P2. An n-type polysilicon film having a thickness of approximately 800 nm is formed over the entire surface, and this film is patterned so as to form a lower capacitor electrode 16. Next, for example, an ONO (oxide film—nitride film—oxide film) capacitive insulation film 17 and, for example, a capacitor upper electrode 18 formed from an n-type polysilicon film having a thickness of 150 nm are formed, the result is a DRAM according to the present invention.

Thus, in accordance with the present invention, by making the film thickness of an insulation film formed on top of the gate electrode 5 thick, the height of the side wall that is formed on the side surface of the gate electrode and the insulation film on the gate electrode is made higher than the height of the selectively grown silicon epitaxy pad 9. The upper surface of the selectively grown silicon epitaxy pad 9 is grown to a desired thickness while maintaining a crystal orientation plane that is the same as the main surface of the substrate. As a result, the height of the selectively grown silicon epitaxy pad upper surface is higher by the amount of the height of the upper surface of the gate electrode, thereby enabling achievement of a pad having the desired performance.

In the case in which the according to the present invention is applied to a DRAM in particular, it is possible to form a contacts which make connections to a bit line, a capacitor lower electrode, and a diffusion layer in a self-aligning manner with respect to the gate electrode, which is also the word line of the memory cell, the result an improvement in the manufacturing yield with regard to high-density DRAMs.

FIG. 8 through FIG. 15 show cross-sectional views which provide the process steps in the second embodiment of a method for manufacturing a semiconductor device according to the present invention. Only the differences in this method with respect to the first embodiment will be described. On the gate electrode 5 is formed a laminate structure, made of a first silicon oxide film 31 that has a thickness of 50 nm, and a first silicon nitride film 6 that has a thickness of 250 nm. An insulation film that is formed on the side surface of the gate electrode 5 and on the side surface of the insulation film on the gate electrode 5 is a second silicon oxide film 32. After deposition of a selectively grown silicon epitaxy layer, part of the second silicon oxide film 32 is removed (FIG. 11(b)).

As a result, the gate electrode is completed covered by a silicon oxide film. In the first embodiment, this was a silicon nitride film. This difference in material is as follows. The dielectric constants of a silicon oxide film and a silicon nitride film are approximately 4 and approximately 8, respectively. As a result, the parasitic capacitance between the gate electrode 5 and the selectively grown silicon epitaxy pad 9 is smaller in the case of the second embodiment, thereby resulting in a reduced bit line parasitic capacitance and an increased DRAM operating margin in the second embodiment. Additionally, the side surface spacer of the MOSFET is a different material, the result being that, in a comparison of hot carrier immunity, the second embodiment has a higher immunity than the first embodiment.

By adopting the above-described technical constitution, a method of manufacturing a semiconductor device according to the present invention causes anisotropic growth of a silicon single crystal in a direction that is perpendicular with respect to the substrate surface so as to form a pad. When this is done, because it is possible to achieve good anisotropic growth precision, problems such as encountered with the prior art, in which neighboring pads made mutual contact, or in which the pad height was insufficient are eliminated, thereby raising the manufacturing yield.

Additionally, by adopting a configuration in which the gate electrode is covered by a silicon oxide film, the bit line parasitic capacitance is made small, thereby making the DRAM operating margin large.

What is claimed is:

1. In a method of manufacturing a semiconductor device in which a gate electrode is provided on a surface of a semiconductor substrate, an insulation film is formed over said gate electrode and the side surface of said gate electrode is covered by a side wall insulation film, and, on a diffusion region that is formed on a surface of said semiconductor substrate at both sides of the above-noted gate electrode and in a region that is sandwiched between said side wall insulation films of adjacent gate electrodes, a silicone single crystal is anisotropically grown in a direction that is perpendicular with respect to said semiconductor substrate, so as to form a pad, the improvement wherein said anisotropic growth of said silicone single crystal is only within a part of the region that is sandwiched between parts of said side wall insulation films that are perpendicular to said semiconductor substrate surface.

2. A method of manufacturing a semiconductor device according to claim 1, wherein said insulation film on said gate electrode and said side wall insulation film are formed by a silicon oxide film.

3. A method of manufacturing a semiconductor device according to claim 2, wherein said insulation film on said gate electrode is formed by a first step of depositing a silicon oxide film onto said gate electrode, and a second step of depositing a silicon nitride film onto said silicon oxide film.

4. A method of manufacturing a semiconductor device according to claim 1, wherein after depositing said insulation film so as to cover the gate electrode, etchback is done to form a side wall and, if the gate electrode film thickness is GT, the thickness of said insulation film on said gate electrode is IT, the thickness of said insulation film that is removed by etchback on said gate electrode is EI, and the height of said pad that is selectively grown is SE, said silicon single crystal growth is done so that the relationship SE <(GT+IT−EI) is satisfied.

5. A method of manufacturing a semiconductor device according to claim 1, wherein at the point at which said silicon single crystal growth is stopped, the height of said pad is greater than the film thickness of said gate electrode.

6. A method of manufacturing a semiconductor device according to claim 1, wherein said semiconductor device is a DRAM.

* * * * *